(12) United States Patent
Bishop

(10) Patent No.: US 6,229,247 B1
(45) Date of Patent: May 8, 2001

(54) MULTI-LAYER PIEZOELECTRIC ELECTRICAL ENERGY TRANSFER DEVICE

(75) Inventor: Richard Patten Bishop, Fairfax Station, VA (US)

(73) Assignee: Face International Corp., Norfolk, VI (US)

(*) Notice: Subject to any disclaimer, the term of this patent is extended or adjusted under 35 U.S.C. 154(b) by 0 days.

(21) Appl. No.: 09/318,966

(22) Filed: May 26, 1999

Related U.S. Application Data

(60) Provisional application No. 60/107,623, filed on Nov. 9, 1998.

(51) Int. Cl.⁷ .................................................... H01L 41/08
(52) U.S. Cl. ............................ 310/328; 310/331; 310/366
(58) Field of Search ........................... 310/328, 330–332, 310/340, 358, 359, 366

(56) References Cited

U.S. PATENT DOCUMENTS

| | | | |
|---|---|---|---|
| 3,174,122 | * 3/1965 | Fowler et al. | 310/321 X |
| 3,363,139 | * 1/1968 | Schiavone | 310/328 X |
| 3,378,704 | * 4/1968 | Miller et al. | 310/328 X |
| 3,487,239 | * 12/1969 | Schafft | 310/328 X |
| 3,489,931 | * 1/1970 | Teaford | 310/328 X |
| 3,590,287 | * 6/1971 | Berlincourt et al. | 310/321 |
| 3,683,211 | * 8/1972 | Perlman et al. | 310/328 X |
| 5,118,982 | * 6/1992 | Inoue et al. | 310/366 |
| 5,329,200 | * 7/1994 | Zaitsu | 310/359 X |
| 5,341,061 | * 8/1994 | Zaitsu | 310/366 X |
| 5,834,882 | * 11/1998 | Bishop | 310/359 |

* cited by examiner

*Primary Examiner*—Mark O. Budd
(74) *Attorney, Agent, or Firm*—Stephen E. Clark; David J. Bolduc

(57) ABSTRACT

A multi-layered piezoelectric electrical energy transfer device has its input and output sides electrically isolated from each other. As a transformer, the device provides step-down voltage conversion while the output signal preserves the input signal frequency in a broad bandwidth. For telecommunications applications, the transformer can provide impedance matching with transmission lines, which minimizes line losses and echoes that seriously degrade high-speed data transmission. The piezoelectric transformer also provides a uniform voltage transformation ratio ($V_{out}/V_{in}$) over wide frequency ranges, and is adaptable for simultaneous audio and data signal telecommunications applications requiring wide bandwidth service.

3 Claims, 6 Drawing Sheets

MULTI-LAYER PIEZOELECTRIC ELECTRICAL ENERGY TRANSFER DEVICE

This application claims the benefit of Provisional Application No. 60/107,623 filed Nov. 9, 1998.

BACKGROUND OF THE INVENTION

1. Field of Invention

The present invention relates to piezoelectric electrical energy transfer devices. More particularly, the present invention relates to a multi-layered piezoelectric transformer whose input and output voltages and currents are isolated from each other, and whose output preserves the input signal frequency in a broad bandwidth.

2. Description of the Prior Art

Wound-type electromagnetic transformers have been used for raising or lowering input voltages (step-up and step-down transformation, respectively) in internal power circuits of devices such as televisions or in charging devices of copier machines which require high voltage, or in circuits requiring a low voltage on the output side, such as in telecommunication circuits. Such electromagnetic transformers take the form of a conductor wound onto a core made of a magnetic substance. Because a large number of turns of the conductor are required to realize high transformation ratios, electromagnetic transformers that are effective, yet at the same time compact and slim in shape are extremely difficult to produce.

To remedy this problem, piezoelectric transformers utilizing the piezoelectric effect have been provided in the prior art. In contrast to the general electromagnetic transformer, the piezoelectric ceramic transformer has a number of advantages. The size of a piezoelectric transformer can be made smaller than electromagnetic transformers of comparable transformation ratio. Piezoelectric transformers can be made nonflammable, and they produce no electromagnetically induced noise.

The ceramic body employed in prior piezoelectric transformers takes various forms and configurations, including rings, flat slabs and the like. A typical example of a prior piezoelectric transformer is illustrated in FIG. 1. This type of piezoelectric transformer is commonly referred to as a "Rosen-type" piezoelectric transformer. The basic Rosen-type piezoelectric transformer was disclosed in U.S. Pat. No. 2,830,274 to Rosen, and numerous variations of this basic apparatus are well known in the prior art. The typical Rosen-type piezoelectric transformer comprises a flat ceramic slab 110 which is appreciably longer than it is wide and substantially wider than thick. As shown in FIG. 1, a piezoelectric body 110 is employed having some portions polarized differently from others. In the case of the prior transformer illustrated in FIG. 1, the piezoelectric body 110 is in the form of a flat slab which is considerably wider than it is thick, and having greater length than width. A substantial portion of the slab 110 the portion 112 to the right of the center of the slab, is polarized longitudinally, whereas the remainder of the slab is polarized transversely to the plane of the face of the slab. In this case the remainder of the slab is actually divided into two portions, one portion 114 being polarized transversely in one direction, and the remainder of the left half of the slab, the portion 116 also being polarized transversely but in the direction opposite to the direction of polarization in the portion 114.

In order that electrical voltages may be related to mechanical stress in the slab 110, electrodes are provided. If desired, there may be a common electrode 118, shown as grounded. For the primary connection and for relating voltage at opposite faces of the transversely polarized portion 114 of the slab 110, there is an electrode 120 opposite the common electrode 118. For relating voltages to stress generated in the longitudinal direction of the slab 110, there is a secondary or high-voltage electrode 122 cooperating with the common electrode 118. The electrode 122 is shown as connected to a terminal 124 of an output load 126 grounded at its opposite end.

In the arrangement illustrated in FIG. 1, a voltage applied between the electrodes 118 and 120 is stepped up to a high voltage between the electrodes 118 and 122 for supplying the load 126 at a much higher voltage than that applied between the electrodes 118 and 120.

An inherent problem of such prior piezoelectric transformers that they have relatively low power transmission capacity. This disadvantage of prior piezoelectric transformers relates to the fact that little or no mechanical advantage is realized between the driver portion of the device and the driven portion of the device, since each is intrinsically a portion of the same electroactive member. This inherently restricts the mechanical energy transmission capability of the device, which, in turn, inherently restricts the electrical power handling capacity of such devices. Additionally, because the piezoelectric voltage transmission function of Rosen-type piezoelectric transformers is accomplished by proportionate changes in the x-y and y-z surface areas (or, in certain embodiments, changes in the x-y and x'-y' surface areas) of the piezoelectric member, which changes are of relatively low magnitude, the power handling capacity of prior circuits using such piezoelectric transformers is inherently low.

Because the typical prior piezoelectric transformer accomplishes the piezoelectric voltage transmission function by proportionate changes in the x-y and y-z surface areas (or, in certain embodiments, changes in the x-y and x'-y' surface areas) of the piezoelectric member, it is generally necessary to alternatingly apply positive and negative voltages across opposing faces of the "driver" portion of the member in order to "push" and "pull", respectively, the member into the desired shape. Prior electrical circuits which incorporate such prior piezoelectric transformers are relatively inefficient because the energy required during the first half-cycle of operation to "push" the piezoelectric member into a first shape is largely lost (i.e. by generating heat) during the "pull" half-cycle of operation. This heat generation corresponds to a lowering of efficiency of the circuit, an increased fire hazard, and/or a reduction in component and circuit reliability. Furthermore, in order to reduce the temperature of such heat generating circuits, the circuit components (typically including switching transistors and other components, as well as the transformer itself) are oversized, which reduces the number of applications in which the circuit can be utilized, and which also increases the cost/price of the circuit.

Another problem with prior piezoelectric transformers is, because the power transmission capacity of such prior piezoelectric transformers is low, it is necessary to combine several such transformers together into a multi-layer "stack" in order to achieve a greater power transmission capacity than would be achievable using one such prior transformer alone. This, of course, increases both the size and the manufacturing cost of the transformer; and the resulting power handling capacity of the "stack" is still limited to the arithmetic sum of the power handling capacity of the individual elements.

Another problem with prior piezoelectric transformers is that they are difficult to manufacture because individual ceramic elements must be polarized at least twice each, and the directions of the polarization must be different from each other.

Another problem with prior piezoelectric transformers is that they are difficult to manufacture because it is necessary to apply electrodes not only to the major faces of the ceramic element, but also to at least one of the minor faces of the ceramic element.

Another problem with prior piezoelectric transformers is that they are difficult to manufacture because, in order to electrically connect the transformer to an electric circuit, it is necessary to attach (i.e. by soldering or otherwise) electrical conductors (e.g. wires) to electrodes on the major faces of the ceramic element as well as on at least one minor face of the ceramic element.

Another problem with prior piezoelectric transformers is that the voltage output of the device is limited by the ability of the ceramic element to undergo deformation without cracking or structurally failing. It is therefore desirable to provide a piezoelectric transformer which is adapted to deform under high voltage conditions without damaging the ceramic element of the device.

It is another problem of prior piezoelectric transformers that they tend to break down (i.e. short) under relatively low voltages.

It is another problem of prior piezoelectric transformers that they do not provide true electrical isolation between the input voltage and the output voltage.

It is another problem with typical magnetic transformers that they are frequency band limited to a bandwidth from 300 Hz to 4,000 Hz. It is therefore desirable to provide a piezoelectric transformer which is adapted to the higher speed data demands of current technology.

It is another problem with prior transformers that, when dealing with the digital circuitry such as ISDN and T1/E1, special transformers must be used that satisfy only the demands of each specific service.

It is another problem with prior transformers that, when dealing with the digital circuitry such as ISDN and T1/E1, separate transformers are necessary for filling the needs of each application frequency bandwidth. This separate need is only satisfied through the use of multiple devices, which is more costly.

Another problem of prior piezoelectric transformers is that the voltage transformation ratio (that is $V_{out}/V_{in}$) is not uniform over wide frequency ranges. Because of this problem, prior piezoelectric transformer applications are typically limited to small frequency ranges (i.e. at or near a natural resonant frequency of the particular device).

Another problem of prior piezoelectric transformers is that because of the problem of non-uniformity of the voltage transformation ratio ($V_{out}/V_{in}$) over wide frequency ranges, prior piezoelectric transformers are not adaptable for simultaneous audio and data signal telecommunications applications requiring wide bandwidth service.

Another problem of prior piezoelectric transformers is that because of the problem of non-uniformity of the voltage transformation ratio ($V_{out}/V_{in}$) over wide frequency ranges, that they require higher input voltages because they do not respond linearly with lower power inputs.

It is another problem with prior transformers that they generate heat, introducing an additional load on the cooling demands of communications equipment.

It is another problem with prior transformers that they generate heat, which introduces noise into telecommunications circuitry.

It is another problem with prior transformers that they cannot withstand heat loads in excess of 600 degrees F., without sustaining damage.

It is another problem with prior transformers that they have low power utilization efficiencies, such as magnetic transformers which have an efficiency loss of up to 40=50%.

It is another problem with prior transformers that in order to handle certain ranges of frequencies, they must have a large size, which is not compatible with inline telecommunications circuitry.

Another problem with prior transformers is that the magnetic core and coiled wire can generate magnetic fields that interfere with surrounding circuitry.

Another problem with prior transformers is that they lack the capability to provide impedance matching with transmission lines which causes line losses and echoes, seriously degrading high-speed data transmission.

Another problem with prior transformers is that they are susceptible to EMF interference Another problem with prior transformers is that they are difficult to miniaturize for applications within circuit chips.

SUMMARY OF THE INVENTION

The term piezoelectric transformer is here applied to an energy-transfer device employing the piezoelectric properties of two co-joined materials to achieve the transformation of voltage or current or impedance. It is a primary object of the present invention to provide a piezoelectric transformer comprising a pair of ceramic elements, each exhibiting piezoelectric properties, which are in physical (mechanical) communication with each other such that deformation of one ceramic element in a plane results in corresponding deformation of the other ceramic element in the same or a substantially parallel plane.

It is another object of the present invention to provide a piezoelectric transformer of the character described in which two piezoceramic elements, each having a pair of opposing major surfaces, are mechanically bonded together with a major surface of one of the piezoceramic elements facing a major surface of the other piezoceramic element along an interface plane.

It is another object of the present invention to provide a piezoelectric transformer of the character described in which two are joined such that when a first voltage is applied across the major surfaces of the first of piezoceramic element, the first piezoceramic element tends to deform in a direction parallel to the interface plane.

It is another object of the present invention to provide a piezoelectric transformer of the character described in which such a deformation of the first piezoceramic element causes a corresponding deformation of the second piezoceramic element in the same direction (i.e. substantially parallel to the interface plane).

It is another object of the present invention to provide a piezoelectric transformer of the character described in which such a deformation of the second piezoceramic element produces a second voltage across the opposing major surfaces of the second piezoceramic element.

It is another object of the present invention to provide a piezoelectric transformer of the character described in which the first and second ceramic layers are mechanically bonded to a dielectric layer along the interface plane.

It is another object of the present invention to provide a piezoelectric transformer of the character described which may be easily and inexpensively produced.

It is another object of the present invention to provide a piezoelectric transformer of the character described which is easy to manufacture because it is sufficient to polarize each ceramic element only once and in only one direction.

It is another object of the present invention to provide a piezoelectric transformer of the character described which is easy to manufacture because it is sufficient to apply electrodes only to the major faces of the ceramic elements, and which does not require application of electrodes to minor faces of the ceramic elements.

It is another object of the present invention to provide a piezoelectric transformer of the character described which is easy to manufacture and miniaturize, for example by using Micro Electronic Machining Systems (MEMS).

It is another object of the present invention to provide a piezoelectric transformer of the character described which is easy to connect or install in an electric circuit, because it is sufficient to attach (i.e. by soldering or otherwise) electrical conductors (e.g. wires) only to electrodes on the major faces of the ceramic element.

It is another object of the present invention to provide a piezoelectric transformer of the character described which is operable over wide input and output frequency bandwidths.

It is another object of the present invention to provide a piezoelectric transformer of the character described in which the voltage transformation ratio (that is, $V_{out}/V_{in}$) is substantially uniform over a wide range of voltage input frequencies.

It is another object of the present invention to provide a piezoelectric transformer of the character described which electrically isolates the voltage and current at the input to the device from the voltage and current at the output of the device.

It is another object of the present invention to provide a piezoelectric transformer of the character described which electrically isolates the voltage and current at the input to the device from the voltage and current at the output of the device under high voltage input conditions without degrading the isolation properties of the transformer.

It is another object of the present invention to provide, in a telecommunications system, a circuit including a transformer of the character described such that data of a frequency may be transmitted through the circuit and faithfully reproduced with the same frequency at the output of the circuit after having undergone an intermediate step of electrical-to-mechanical-to-electrical transformation.

It is another object of the present invention to provide, in a telecommunications system, a circuit including a transformer of the character described such that the data transmitted through the transformer in the form of voltage input signals may be in the low-frequency audio range to a high-frequency data range.

It is another object of the present invention to provide, in a telecommunications system, a circuit including a transformer of the character described in which the voltage transformation ratio ($V_{out}/V_{in}$) of data signals input to the circuit is substantially uniform within a frequency range between 10 Hz and 30 kHz.

It is another object to provide a modification of the present invention in which, in a telecommunications system, a circuit including a transformer of the character described in which the voltage transformation ratio ($V_{out}/V_{in}$) of data signals input to the circuit is substantially uniform within a frequency range between 30 kHz and 75 MHz.

It is another object of the present invention to provide, in a telecommunications system, a circuit including a transformer of the character described in which the data signals input to the circuit are electrically isolated from the data signals output from the circuit.

It is another object of the present invention to provide, in a telecommunications system, a circuit including a modification of the described transformer, in which the voltage transformation ratio ($V_{out}/V_{in}$) of data signals input to the circuit is substantially uniform over a frequency bandwidth of over 1 GHz.

It is another object of the present invention to provide, in a telecommunications system, a circuit including a transformer of the character described in which the transformer has a high energy transmission efficiency, which reduces heat generation.

It is another object of the present invention to provide, in a telecommunications system, a circuit including a transformer of the character described in which the transformer has a high resistance to EMF interference.

It is another object of the present invention to provide, in a telecommunications system, a circuit including a transformer of the character described in which the transformer introduces little or no electrical noise into the circuit.

It is another object of the present invention to provide, in a telecommunications system a circuit including a transformer of the character described in which the transformer has high impedance.

It is another object of the present invention to provide, in a telecommunications system, a circuit including a transformer of the character described in which the transformer is capable of providing impedance matching with circuit power lines.

It is another object of the present invention to provide a piezoelectric transformer of the character described which is operable throughout a broad thermal range.

Further objects and advantages of my invention will become apparent from a consideration of the drawings and ensuing description thereof.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DESCRIPTION OF THE PREFERRED EMBODIMENT

Figure 1:
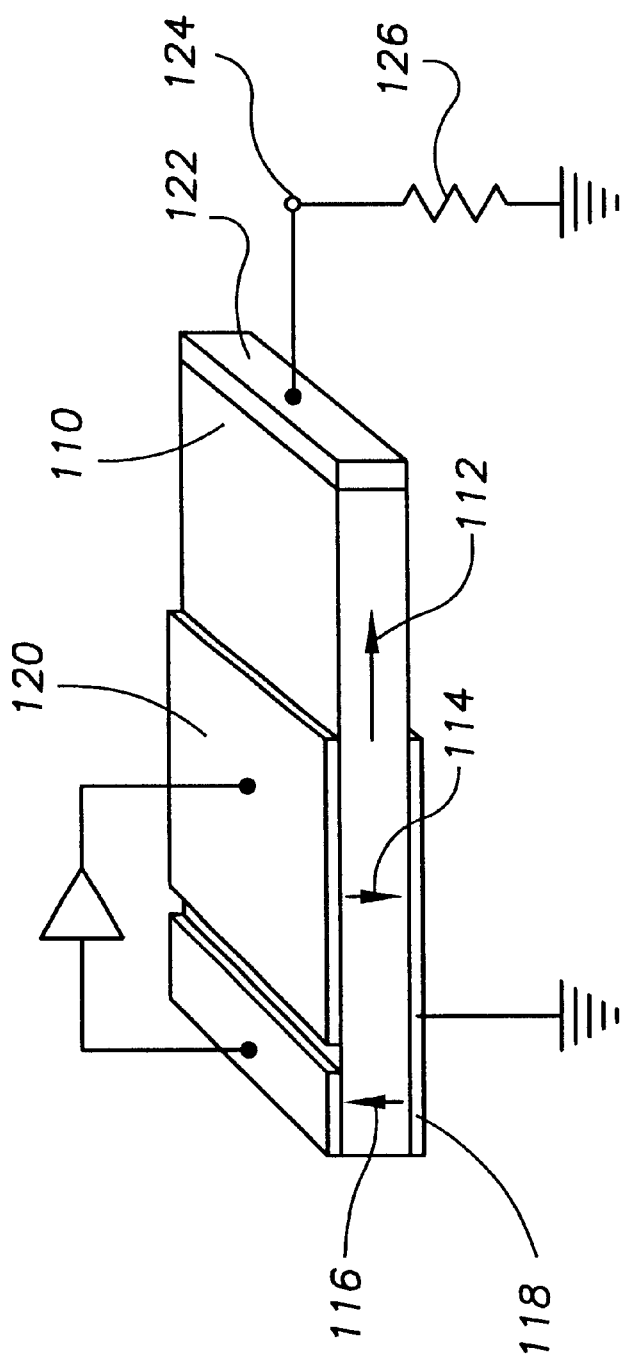
FIG. 1 is a perspective view showing the construction of a Rosen-type piezoelectric transformer of the prior art.
Figure 2:
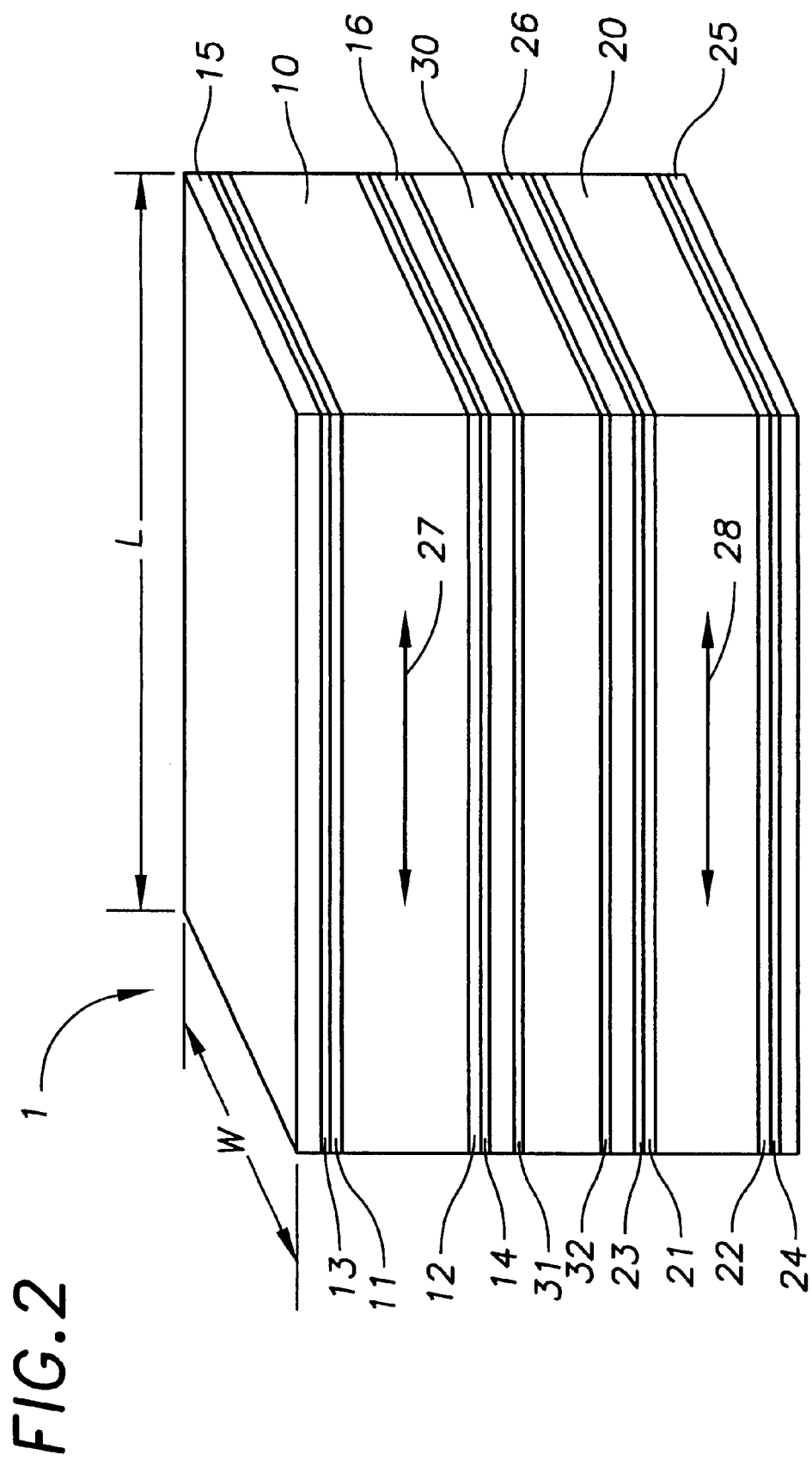
FIG. 2 is a perspective view showing the preferred embodiment of a wideband isolating piezoelectric transformer constructed in accordance with the present invention.

In the preferred embodiment of the invention, an isolating wideband piezoelectric transformer (generally designated 1 in the accompanying drawing figures) is manufactured by stacking and bonding together a number of laminate layers as illustrated in FIG. 2 and as will be more fully described below.

In the preferred embodiment of the invention, the transformer 1 comprises a first piezoelectric ceramic layer 10 and a second piezoelectric ceramic layer 20. The first piezoelectric ceramic layer 10 is preferably in the form of a slab having two substantially parallel major faces. The second piezoelectric ceramic layer 20 is also preferably in the form of a slab (of approximately the same geometry and size as the first piezoelectric ceramic layer 10) having two substantially parallel major faces. First and second piezoelectric ceramic layers 10 and 20 preferably comprise discrete members having electrodes 11 and 12, and 21 and 22, respectively, electro-deposited on their two opposing major faces. Electrodes 11, 12, 21 and 22 substantially extend over the respective opposing surfaces of ceramic layers 10 and 20.

An adhesive 13 and 24, such as "Cibageigy AV118" as manufactured by Ciba Specialty Chemicals Corporation, N. A. of East Lansing, Mich., is used to bond a first exterior electrode 15 to electrode 11, and second exterior electrode 25 to electrode 22, respectively. An adhesive 14 and 23, such as "Cibageigy AV118", is used to bond a first intermediate electrode 16 to electrode 12, and second intermediate electrode 26 to electrode 21, respectively.

In the preferred embodiment of the invention, the corresponding facing electroplated surfaces of two ceramic layers 10 and 20 are electrically insulated from each other by a dielectric layer 30. An adhesive 31 and 32, such as "Cibageigy AV118" is used to bond faces of the dielectric layer 30 to first intermediate electrode 16 and second intermediate electrode 26, respectively. The dielectric layer 30 should be constructed from a material with insulator properties, good adhesion and having thermal and mechanical properties similar to the ceramic layers. Suitable materials include Mica, another ceramic or other thin film such as "KAPTON" film, manufactured by E. I. Du Pont De Nemours & Company, of Wilmington, Del.

During manufacture of the transformer 1 the entire stack of laminate layers (i.e. the two ceramic layers 10 and 20, the dielectric layer 30, the electrodes 15, 16, 25 and 26 and the adhesive layers 12, 13, 23, 24, 31 and 32) are arranged as described herein above and as illustrated in FIG. 2, and simultaneously heated to a temperature above the melting point of the adhesive materials 12, 13, 23, 24, 31 and 32. In the preferred embodiment of the invention, the adhesive material used is a very strong adhesive which has a coefficient of thermal contraction which is greater than that of most ceramics (and, in particular, is preferably greater than that of the materials of the two ceramic layers 10 and 20).

While "Cibageigy AV118" adhesive is used in the preferred embodiment of the invention, it is within the scope of the present invention to use other adhesives, such as LaRC-SI$_{TM}$ adhesive, a thermoplastic soluble imide developed by NASA-Langley Research Center and commercially marketed by IMITEC, Inc. of Schenectady, N.Y. Desirable properties in the adhesive are a melting point below that of the other laminate layers of the transformer, the capability to harden to apply a bond between the respective layers of the transformer 1, and the capability to transfer longitudinal stress to adjacent layers of the transformer 1.

After the entire stack of laminate layers (i.e. the two ceramic layers 10 and 20, the dielectric layer 30, the electrodes 15, 16, 25 and 26, and the adhesive layers 12, 13, 23, 24, 31 and 32) have been heated to a temperature above the melting point of the adhesive materials 12, 13, 23, 24, 31 and 32, the entire stack of laminate layers (i.e. the two ceramic layers 10 and 20, the dielectric layer 30, the electrodes 15, 16, 25 and 26, and the adhesive layers 12, 13, 23, 24, 31 and 32) are then permitted to cool to ambient temperature. As the temperature of the laminate layers (i.e. the two ceramic layers 10 and 20, the dielectric layer 30, the electrodes 15, 16, 25 and 26, and the adhesive layers 12, 13, 23, 24, 31 and 32) falls below the melting temperature of the adhesive materials 12, 13, 23, 24, 31 and 32 the adhesive layers 12, 13, 23, 24, 31 and 32 solidify, bonding them to the adjacent layers. During the cooling process the ceramic wafers 10 and 20 become compressively stressed (prestressed) along their longitudinal axes due to the relatively higher coefficient of thermal contraction of the materials of construction of the adhesive layers 12, 13, 23, 24, 31 and 32.

It will be understood that a piezoelectric transformer 1 constructed in accordance with the preceding description comprises a pair of longitudinally pre-stressed (i.e. compressed) piezoelectric ceramic layers which are intimately bonded to each other (albeit separated by adhesive layers and a dielectric layer) along one of their major faces. The composite structure (1) has a longitudinal plane that is substantially parallel to the planes of interface between the dielectric layer 30 and first and second ceramic layers 10 and 20. A piezoelectric transformer 1 may also be manufactured without the use of adhesives (comprising the two ceramic layers 10 and 20, the dielectric layer 30, the electrodes 15, 16, 25 and 26) by using a bonding process such as cofiring, ultrasonic welding or eutectic bonding.

Figure 5:
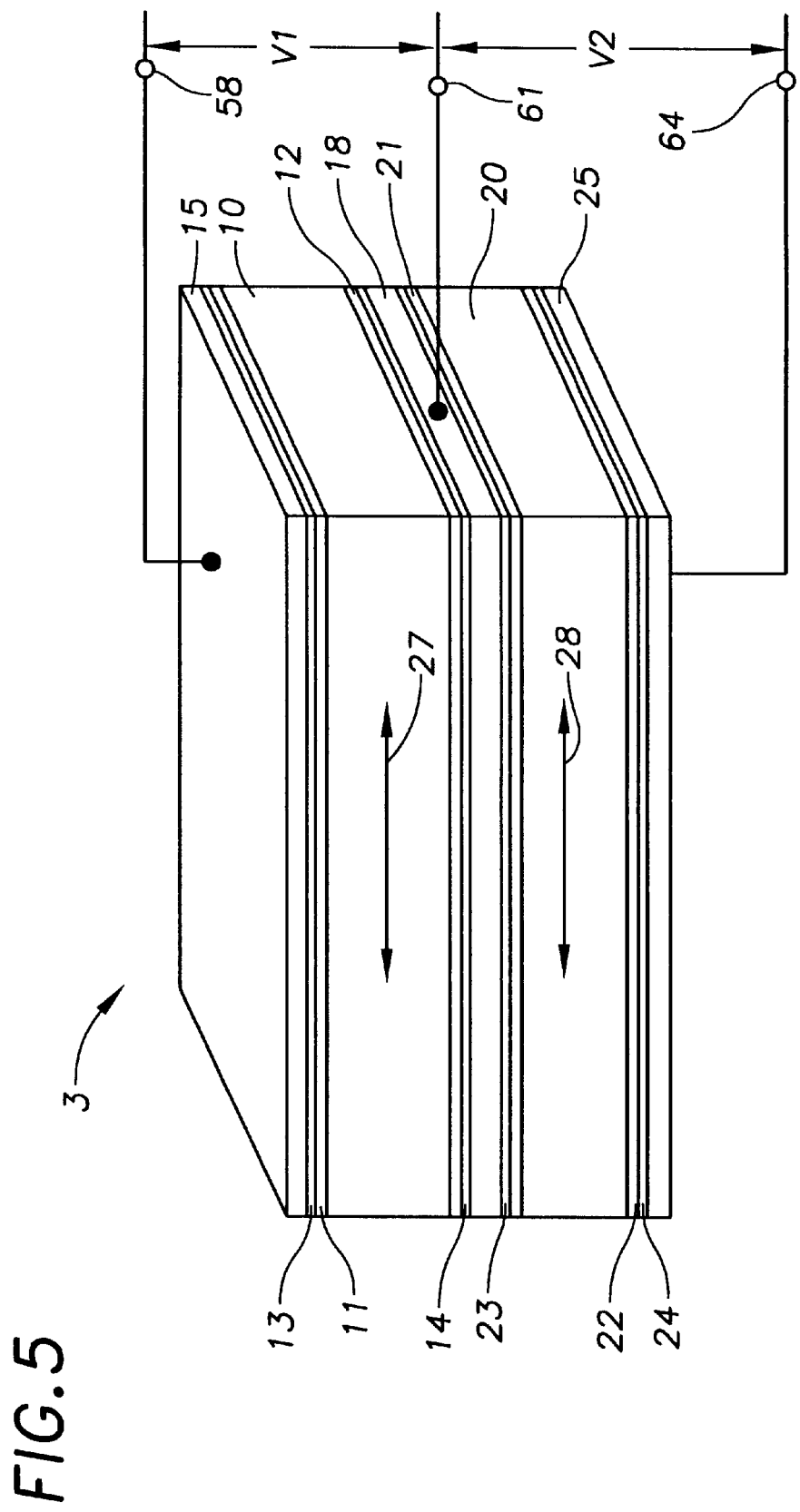
FIG. 5 is a perspective view of a modified embodiment of an ultra-wideband non-isolating piezoelectric transformer.

Referring now to FIG. 5: In an alternative embodiment of a transformer 3, the dielectric layer 30 is omitted. In this embodiment of an non-isolating transformer 3, adhesive 13 and 24, such as "Cibageigy AV118" is used to bond a first exterior electrode 15 to electrode 11, and second exterior electrode 25 to electrode 22, respectively. An adhesive 14 and 23, such as "Cibageigy AV118", is used to bond a common intermediate electrode 18 to electrode 12 and to electrode 21, respectively.

During manufacture of the transformer 3 the entire stack of laminate layers (i.e. the two ceramic layers 10 and 20, the electrodes 15, 16, and 18 and the adhesive layers 12, 13, 23 and 24) are arranged as described herein above and as illustrated in FIG. 5, and simultaneously heated to a temperature above the melting point of the adhesive materials 12, 13, 23 and 24. In the preferred embodiment of the invention, the adhesive material used is a very strong adhesive which has a coefficient of thermal contraction which is greater than that of most ceramics (and, in particular, is preferably greater than that of the materials of the two ceramic layers 10 and 20).

After the entire stack of laminate layers (i.e. the two ceramic layers 10 and 20, the electrodes 15, 16, and 18, and the adhesive layers 12, 13, 23 and 24) have been heated to a temperature above the melting point of the adhesive materials 12, 13, 23 and 24, the entire stack of laminate layers (i.e. the two ceramic layers 10 and 20, the electrodes 15, 16 and 18, and the adhesive layers 12, 13, 23 and 24) are then permitted to cool to ambient temperature. As the temperature of the laminate layers (i.e. the two ceramic layers 10 and 20, the electrodes 15, 16 and 18, and the adhesive layers 12, 13, 23 and 24) falls below the melting temperature of the adhesive materials 12, 13, 23 and 24 the adhesive layers solidify, bonding them to the adjacent layers. During the cooling process the ceramic wafers 10 and 20 become compressively stressed (prestressed) along their longitudinal axes due to the relatively higher coefficient of thermal contraction of the materials of construction of the adhesive layers 12, 13, 23 and 24.

It will be understood that a piezoelectric transformer 3 as constructed in accordance with the preceding description comprises a pair of longitudinally pre-stressed (i.e. compressed) piezoelectric ceramic layers which are intimately bonded to each other (albeit separated by adhesive layers) along one of their major faces. The composite structure (3) has a longitudinal plane that is substantially parallel to the planes of interface between the first and second ceramic layers 10 and 20. A piezoelectric transformer 3 may also be manufactured without the use of adhesives (comprising the two ceramic layers 10 and 20, and the electrodes 15, 16 and 18) by using a bonding process such as cofiring, ultrasonic welding or eutectic electrode bonding.

Copending U.S. patent application No. 08/864,029 filed May 27, 1997 (SVC023), which is included by reference thereto, describes a multilayered, laminated, piezoelectric transformer which demonstrates the ability to convert a primary or input voltage V1 to a secondary or output voltage V2 through the application of voltage V1 to a first polarized piezoelectric ceramic wafer. The application of voltage V1 to the first piezoelectric wafer generates an extensional stress in that wafer which is then mechanically transmitted to a second tightly adhered polarized piezoelectric ceramic wafer which undergoes a similar and proportional extensional stress, producing output voltage V2. The ratio of the first voltage V1 to the second voltage V2 is a function of the piezoelectric properties of the two wafers, the size and geometry of the two wafers and the size and elasticity of the ceramic wafers and other adhesive and pre-stress layers as well as the poling characteristics of the ceramic wafers utilized in the devices described in the above-referenced U.S. patent application.

Copending U.S. patent application No. 60/092,284 filed Jul. 10, 1998 (SVC045), which is included by reference thereto, describes a method of manufacturing a piezoelectric transformer by ultrasonically welding together adjacent layers of the transformer.

Copending U.S. patent application No. 09/777,767 filed Oct. 23, 1998 (SVC048), which is included by reference thereto, describes a method of manufacturing a piezoelectric transformer by cofiring of the laminate layers.

Figure 3:
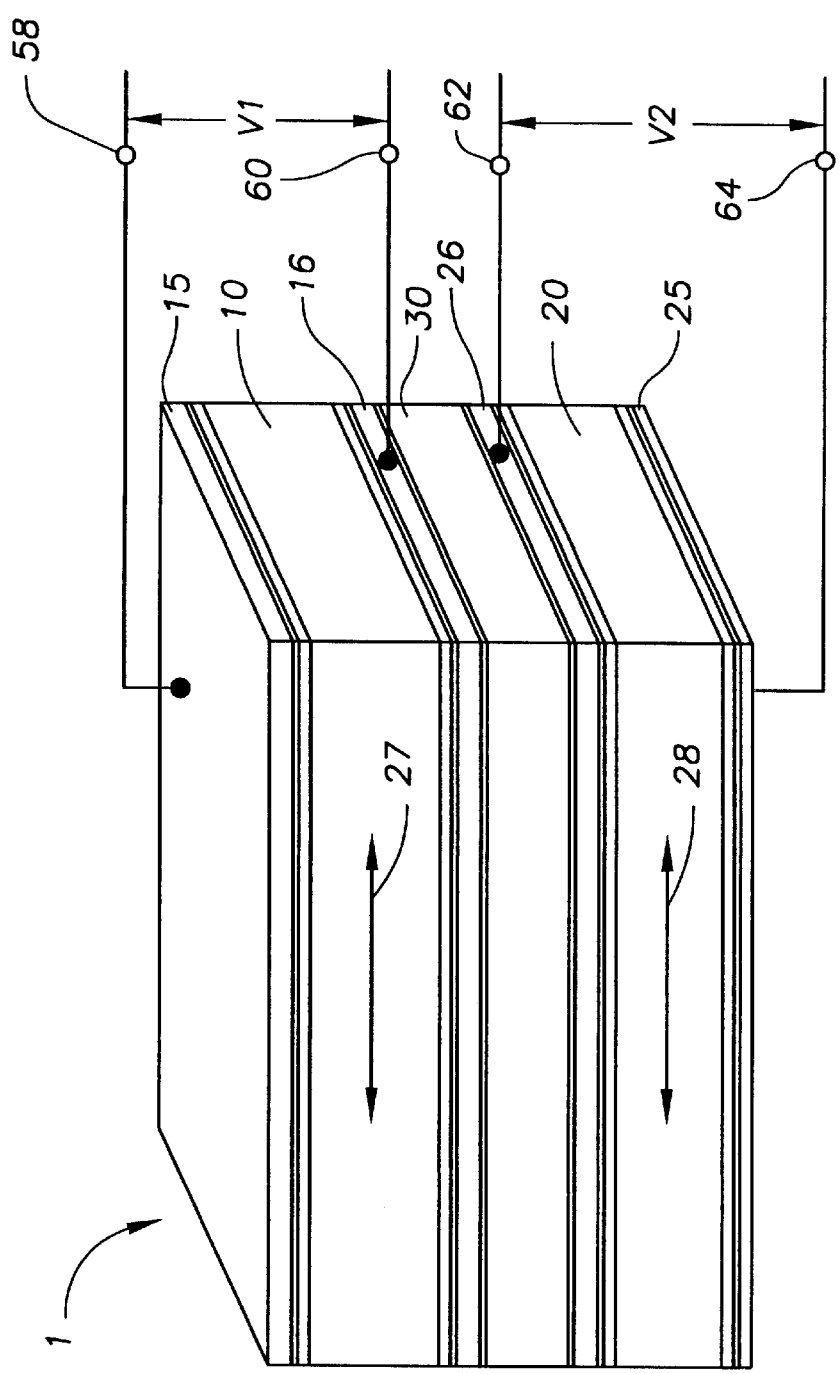
FIG. 3 is a perspective view showing the preferred embodiment of a wideband isolating piezoelectric transformer with the preferred electrical terminal configuration.

Referring to FIG. 3: It will be appreciated that in this embodiment of the transformer 1 the two piezoelectric ceramic layers 10 and 20 are completely electrically isolated from each other by the dielectric layer 30. Thus it will be understood that a transformer 1 constructed in accordance with this embodiment of the invention may be used in an electric circuit to electrically protect electrical components "downstream" from the transformer from damage from high current discontinuities "upstream" of the transformer.

The first and second exterior electrodes 15 and 25 of the transformer 1, are connected to electric terminals 58 and 64, respectively. In the preferred embodiment of the transformer, the first and second intermediate electrodes 16 and 26 are connected to electric terminals 60 and 62. It will be appreciated that in this embodiment of the transformer the two piezoelectric ceramic layers 10 and 20 are electrically isolated from each other by dielectric layer 30.

Figure 4:
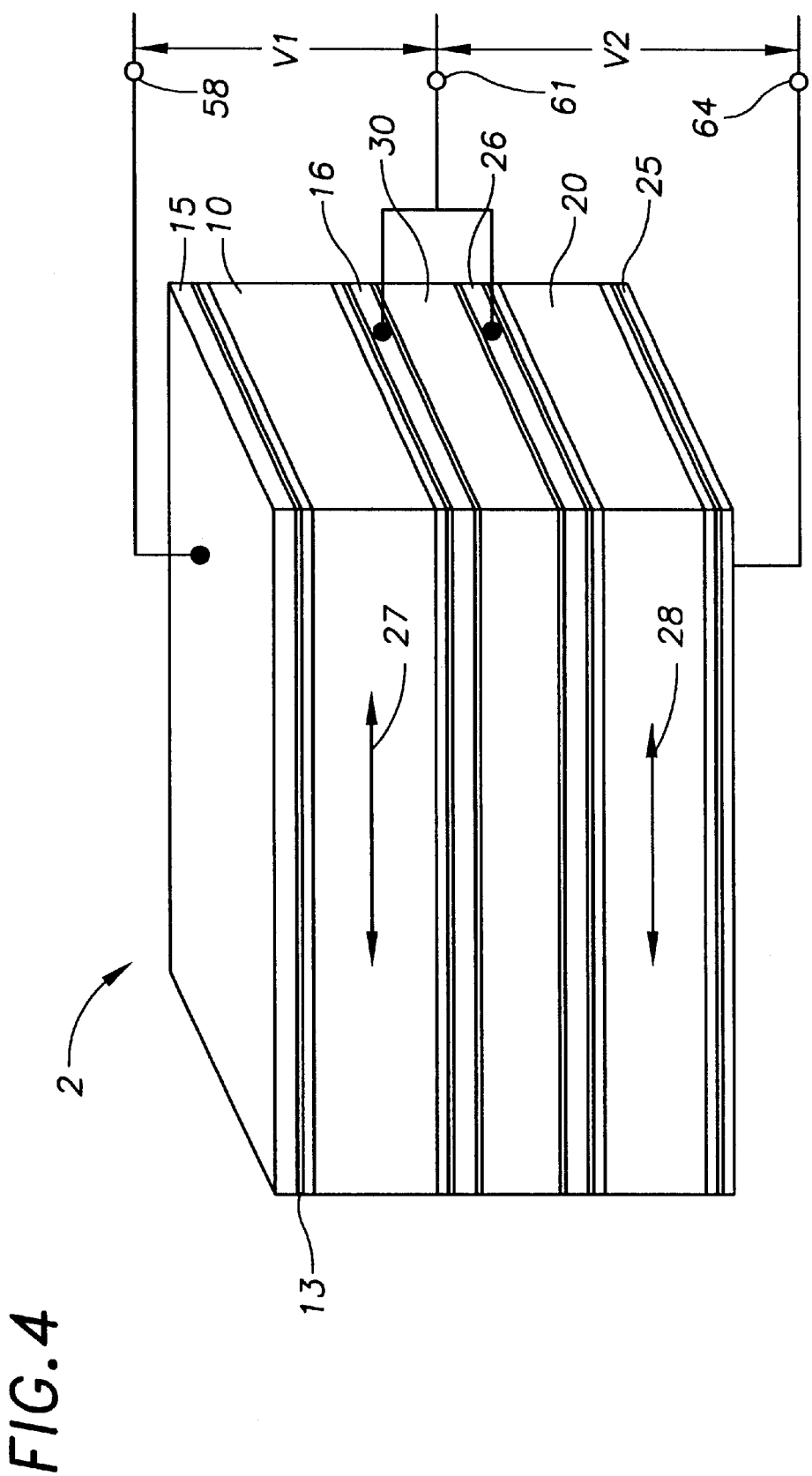
FIG. 4 is a perspective view of an ultra-wideband non-isolating piezoelectric transformer.

In an alternative embodiment of the transformer 2 (as shown in FIG. 4), the first and second intermediate electrodes 16 and 26, respectively, are electrically connected to a common electric terminal 61. It will be appreciated that in this embodiment of the transformer 2, the two piezoelectric ceramic layers 10 and 20, although separated by a dielectric layer 30, are not electrically isolated from each other.

In the embodiment of the transformer 3 (as shown in FIG. 5), the first and second intermediate electrodes 16 and 26 as well as the dielectric layer 30 are replaced by common electrode 18. Electrode 18 is electrically connected to a common electric terminal 61. It will be appreciated that in this embodiment of the transformer 3, the two piezoelectric ceramic layers 10 and 20, are not electrically isolated from each other.

The ceramic layers 10 and 20 are each electrically polarized (substantially throughout their respective masses) in a direction perpendicular to the longitudinal plane of the composite structure (1). More specifically, in the preferred embodiment of the invention, the direction of polarization of ceramic layer 10 is parallel to, but opposite to the direction of polarization of ceramic layer 20. This corresponds to the ceramic layers 10 and 20 having parallel and opposite polarities (+/− and −/+, or −/+ and +/−, respectively). Alternatively, the ceramic layers may however be polarized in the same direction.

In the preferred embodiment of the piezoelectric transformer 1 or 3 each of the ceramic layers 10 and 20 is polarized such that when a voltage potential is applied across the corresponding electrodes on its respective major faces, the layer will longitudinally strain. Conversely, in the preferred embodiment of the piezoelectric transformer 1 or 3 each of the ceramic layers 10 and 20 is polarized such that when either of the ceramic layers 10 and 20 is longitudinally strained a voltage potential is generated between the corresponding electrodes, on its respective major faces.

In other words, in the transformer 1, ceramic layer 10 is polarized between electrode 15 and electrode 16 such that when a first voltage V1 of a first polarity is applied between electrode 15 and electrode 16, ceramic layer 10 tends to elongate (as indicated by arrow 27) in a direction parallel to the longitudinal plane of the composite structure; and when a voltage V1 of a second polarity is applied between electrode 15 and electrode 16, ceramic layer 10 tends to contract in a direction parallel to the longitudinal plane of the composite structure. Similarly, ceramic layer 20 is polarized between electrode 25 and electrode 26 such that when a second voltage V2 of a first polarity is applied between electrode 25 and electrode 26, ceramic layer 20 tends to elongate (as indicated by arrow 28) in a direction parallel to the longitudinal plane of the composite structure; and when a voltage V2 of a second polarity is applied between electrode 25 and electrode 26, ceramic layer 20 tends to contract in a direction parallel to the longitudinal plane of the composite structure.

In the transformer 3 of FIG. 5, ceramic layer 10 is polarized between electrode 15 and electrode 18 such that when a first voltage V1 of a first polarity is applied between electrode 15 and electrode 18, ceramic layer 10 tends to elongate (as indicated by arrow 27) in a direction parallel to the longitudinal plane of the composite structure; and when a voltage V1 of a second polarity is applied between electrode 15 and electrode 18, ceramic layer 10 tends to contract in a direction parallel to the longitudinal plane of the composite structure 3. Similarly, ceramic layer 20 is polarized between electrode 25 and electrode 18 such that when a second voltage V2 of a first polarity is applied between electrode 25 and electrode 18, ceramic layer 20 tends to elongate (as indicated by arrow 28) in a direction parallel to the longitudinal plane of the composite structure;

and when a voltage V2 of a second polarity is applied between electrode 25 and electrode 18, ceramic layer 20 tends to contract in a direction parallel to the longitudinal plane of the composite structure 3.

As will become apparent from the following disclosure, the just-described polarization characteristics of the ceramic layers 10 and 20 are useful in order to understand that the two ceramic layers 10 and 20 are similarly polarized substantially across their entire cross-sections and that the directions of polarization of each ceramic layer 10 and 20 are parallel to each other (i.e. perpendicular to the longitudinal plane of the composite structure, and in opposite directions).

However, as will be explained more fully herein below, in the preferred operation of the present invention one ceramic layer (e.g. 10) serves as a "driver" section that may longitudinally extend or contract upon application (e.g., across electrodes 15 and 16) of a first voltage, and the other ceramic layer (e.g. 20) serves as a "driven" section that may piezoelectrically generate a second voltage (e.g., across electrodes 25 and 26) when physically strained in a direction parallel the longitudinal plane of the composite structure.

Because ceramic layers 10 and 20 are constructed of piezoelectric materials, preferably PZT, which are transversely polarized, when a voltage V1 (of a first polarity) is applied across electrodes 15 and 16 (or 15 and 18), ceramic layer 10 tends to piezoelectrically elongate as indicated by arrows 27 in a direction substantially parallel to the longitudinal plane of the composite structure. For the embodiments illustrated in FIGS. 3 and 4, this elongation (27) of ceramic layer 10 is translated through the dielectric layer 30 to the second (driven) ceramic layer 20, which begins to elongate in a like direction. For the embodiment illustrated in FIG. 5, this elongation (27) of ceramic layer 10 is directly to the second (driven) ceramic layer 20, which begins to elongate in a like direction. This substantially longitudinal elongation of ceramic layer 20 results in the piezoelectric generation of a second voltage V2 between electrodes 25 and 26 (or 25 and 18). Similarly, when the polarity of the voltage V1 across electrodes 15 and 16 (or 15 and 18) is reversed, a second voltage V2 of reverse polarity is developed between electrodes 25 and 26 (or 25 and 18).

Referring to FIGS. 3 and 4: When a primary (i.e. input) voltage V1 is applied across terminals 58 and 60 (or 58 and 61) connected to the electrodes 15 and 16 of the first ceramic layer 10, the first ceramic layer 10 will piezoelectrically generate an extensional stress. As used herein, "extensional stress" and cognate terms refer to stress which is parallel to the plane of interface of the two ceramic layers 10 and 20, that is: parallel to the major surfaces of the piezoelectric ceramic layers 10 and 20. The extensional stress is commensurate with the magnitude of the input voltage V1, the piezoelectric properties of the ceramic layer 10 material, the size and geometry of the ceramic layer 10, and the elasticity of the other materials of the other laminate layers (i.e. the second ceramic layer 20, the electrode layers 15, 16, 25 and 26, and the adhesive layers 13, 14, 23, 24, 31 and 32) which are bonded to the first ceramic layer 10.

The extensional stress which is generated by the input voltage V1 causes the first ceramic layer 10 to be longitudinally strained, (i.e. parallel to the major surfaces of the first ceramic layer 10, as indicated by arrow 27). Because the first ceramic layer 10 is securely bonded to the dielectric layer 30, which is securely bonded to the second ceramic layer 20 (i.e. by adhesive layers 14, 31, 32 and 23), any longitudinal strain 27 of the first ceramic layer 10 will result in a longitudinal strain (in the same direction and of substantially the same magnitude) in the second ceramic layer 20 (as indicated by arrow 28). The longitudinal strain 28 of the second piezoelectric ceramic layer 20 generates a voltage potential V2 across the two electrodes 25 and 26 of the second ceramic layer 20. The electric terminals 62 and 64 (or 61 and 64) may be electrically connected to corresponding electrodes 25 and 26 of the second ceramic layer 20.

The magnitude of the piezoelectrically generated voltage V2 between the two electrodes 25 and 26 of the second ceramic layer 20 depends upon the piezoelectric properties of the ceramic layer 20 material, and the size, geometry and polarity of the ceramic layer 20.

It will be understood that the ratio of the first voltage V1 to the second voltage V2 is a function of the piezoelectric properties of the ceramic layers 10 and 20, the size and geometry of the ceramic layers 10 and 20 material, the elasticity of the other materials of the other laminate layers (i.e. ceramic layers 10 and 20, the dielectric layer 30, the electrode layers 15, 16, 25 and 26, and the adhesive layers 13, 14, 23, 24, 31 and 32), and the polarity characteristics of the two ceramic layers 10 and 20. It will also be understood that the first voltage V1 may alternatively be either an "input" (i.e. primary) voltage or an "output" (i.e. secondary) voltage, and the second voltage V2 may respectively be either an "output" (i.e. secondary) voltage or an "input" (i.e. primary) voltage.

It will be understood from the foregoing description that in a piezoelectric transformer constructed in accordance with the present invention, a voltage input to one piezoelectric ceramic layer 10 causes extensional strain 27 which is substantially replicated by extensional strain 28 in the other piezoelectric layer 20. Accordingly, the order of magnitude of strain in the first ceramic layer 10 is the same as the order of magnitude of strain in the second ceramic layer 20. It has been observed that when the two ceramic layers 10 and 20 are of substantially the same size and geometry and when the polarity of the two ceramic layers 10 and 20 are of substantially the same magnitude and parallel in direction, the voltage output V2 from the device will be substantially proportional to the voltage input V1 to the device over a wide bandwidth of voltage input V1 frequencies. In other words, the transformation ratio (V2/V1) is substantially uniform over a wide range of voltage input V1 frequencies.

It has been found that the bandwidth of voltage input V1 frequencies over which the transformation ratio (V2/V1) can be maintained at a substantially uniform value may be controlled by varying the size and shape of the transformer 1, 2 or 3. It has also been found that the bandwidth of voltage input V1 frequencies over which the transformation ratio (V2/V1) can be maintained at a substantially uniform value may be increased by selecting ceramic wafers having asymmetric shapes.

In the preferred embodiment of the invention the transformer 1, 2 or 3 has an asymmetric (i.e. non-circular, irregularly-shaped) geometry. This geometry is desirable in broad bandwidth transformer applications because the asymmetry causes secondary and harmonic vibrations that reduce resonant frequency spikes. (As opposed to a circular shape of a transformer which may be desirable in step-up, narrow bandwidth transformer applications because the symmetry reduces the introduction of interfering secondary and harmonic vibrations in the device, thus producing narrow band resonant characteristics).

Referring to FIG. 2: In the preferred embodiment of the broad bandwidth transformer, the transformer 1 has an irregular rectangular shape (i.e., a non-integer ratio between its length L and width W). Alternatively, the transformer may have a scalene triangular shape (i.e., neither isosceles nor equilateral). Other suitable irregularly shaped transducers include oval, trapezoidal, irregular hexagonal geometries.

Figure 6:
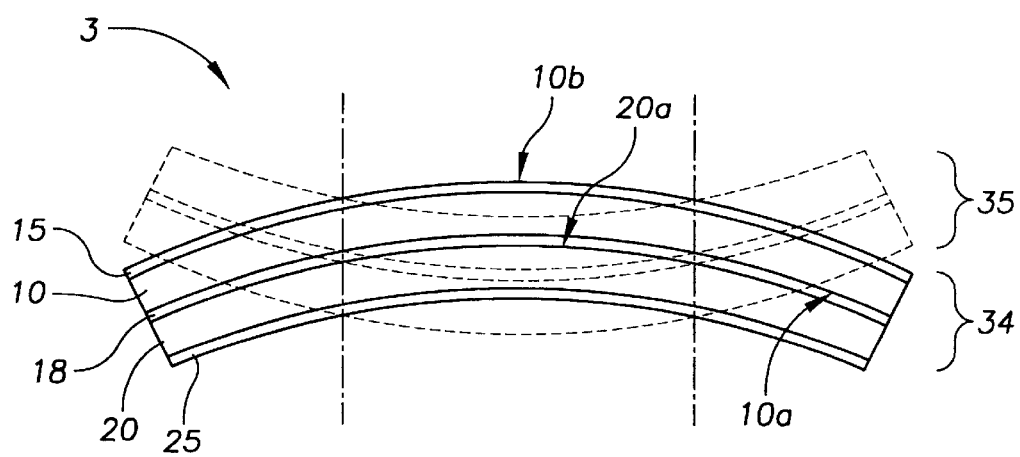
FIG. 6 is a schematic side view showing the flexing which the piezoelectric transformer of FIG. 2 undergoes upon application of voltages of different polarities.
Figure 7:
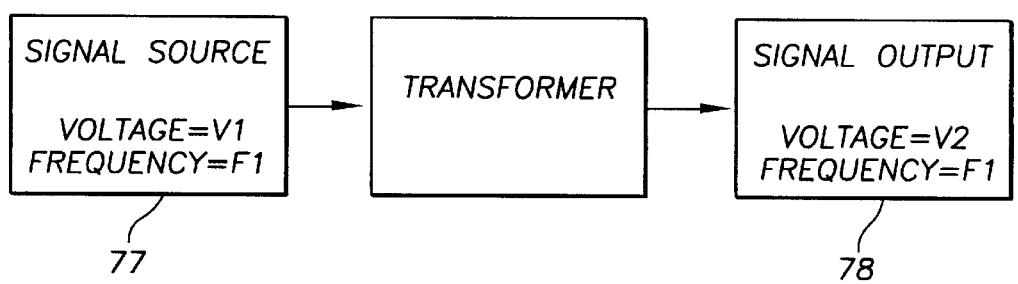
FIG. 7 is a schematic illustrating the piezoelectric transformer's conversion of an input signal to an output signal, while preserving the frequency of the input signal.

Referring now to FIG. 6: FIG. 6 is a schematic side view showing the flexing which the transformer 3 undergoes upon the application of a voltage. FIG. 6 schematically illustrates a transformer 3 having first and second piezoelectric ceramic layers 10 and 20 bonded along a longitudinal plane to an intermediate electrode 18. Electrodes 15 and 25 are disposed on the outboard opposing surfaces of ceramic layers 10 and 20, respectively. Ceramic layers 10 and 20 are electrically polarized in the manner described above. It will be understood that the flexing of transformer 3 illustrated in FIG. 6 is also experienced by the embodiments of the transformer illustrated in FIGS. 3 and 4.

When a voltage of a first polarity is applied between exterior electrode 15 and intermediate electrode 18, ceramic layer 10 begins to elongate in a direction substantially parallel to the longitudinal plane of the composite structure 3. Such expansion of ceramic layer 10 is opposed by ceramic layer 20, to which it is bonded at their respective interior surfaces 10a and 20a. Such expansion of ceramic layer 10 causes a tensile stress at the interior surface 20a of ceramic layer 20. This tensile stress at the interior surface 20a of ceramic layer 20 develops a moment in ceramic layer 20, which, in turn, causes ceramic layer 20 to curve as indicated by dashed lines (position 35) in FIG. 6. In addition, because the expansion of the interior surface 10a of the first ceramic is resisted by the compressive force of ceramic layer 20, while the expansion of the exterior surface 10b of ceramic layer 10 is not subjected to a similar force, ceramic layer 10 also tends to curve as indicated by dashed lines (position 35) in FIG. 6.

The piezoelectric ceramic layer will vibrate at the frequency of the voltage applied between electrodes 15 and 18 and the composite structure will vibrate as illustrated in FIG. 6 (from position 34 to position 35). It will be understood that because the composite structure vibrates at the same the frequency of the input voltage, that the frequency of output voltage will match that input frequency. Resonant spikes will not interfere with the matching of output to input frequencies because the asymmetric shape of the transformer 3 causes interfering secondary and harmonic vibrations in the device that inhibit resonant vibration.

In the preferred embodiment of the invention the ceramic layer 10 on the "driver" side of the transformer 1 is made of a "hard" ceramic material. "Hard" ceramics are desirable because they can withstand high levels of electrical excitation and mechanical stress and typically have high Q factors. Examples of "hard" ceramic materials include, but are not limited to; PZT-4 (DOD Type I) and PZT-8 (DOD Type III) as manufactured by Morgan Matroc Company; or APC-841 as manufactured by American Piezo Ceramics, Inc. By way of example, APC 841 has the following characteristics: 0.35% dissipation factor measured at C1 KC@ Low Field; 320 degree C. Curie Temperature; 0.033 to 0.067 coupling coefficient; 109 m/V to $450 \times 10^{-12}$ m/V piezoelectric coefficient; 10.5 to $35 \times 10^{-3}$ $m^2/C$ piezoelectric coefficient; 6.3 to $7.6 \times 10^{10}$ $N/m^2$ Young's Modulus; 2070 m/s longitudinal mode frequency constant; 1710 m/s thickness mode frequency constant; 2260 radial mode frequency constant; 11.7 to $17.3 \times 10^{12}$ $m^2/N$ elastic compliance; 7.6 g/cc density; and 1400 mechanical quality ("$Q_m$") factor.

In the preferred embodiment of the invention the ceramic layer 20 on the "driven" side of the transformer 1 is made of a "soft" ceramic material. A "soft" ceramic is desirable on the driven side of the transformer 1 because they offer relatively less resistance to being mechanically deformed than harder ceramic materials. Examples of "soft" ceramic materials include, but are not limited to; PZT-5A (DOD Type II) and PZT-5B (DOD Type III) as manufactured by Morgan Matroc Company; or APC-850 as manufactured by American Piezo Ceramics, Inc. By way of example, APC 850 has the following characteristics: 1.4% dissipation factor measured at C1 KC@ Low Field; 360 degree C. Curie Temperature; 0.036 to 0.072 coupling coefficient; 175 m/V to $590 \times 10^{-12}$ m/V piezoelectric coefficient; 12.4 to $36 \times 10^{-3}$ $m^2/C$ piezoelectric coefficient; 5.4 to $6.3 \times 10^{10}$ $N/m^2$ Young's Modulus; 1900 m/s longitudinal mode frequency constant; 1530 m/s thickness mode frequency constant; 2030 radial mode frequency constant; 15.3 to $17.3 \times 10^{12}$ $m^2/N$ elastic compliance; 7.7 g/cc density; and 80 mechanical quality ("$Q_m$") factor.

It has been observed that when the transformer 1 is constructed as described above, it is possible to achieve a deformation of ceramic layers 10 and 20 one or more orders of magnitude greater than would be possible by planar piezoelectric deformation alone (such as in prior "Rosen-type" piezoelectric transformers). When an input voltage across ceramic layer 10 causes ceramic layer 10 to piezoelectrically deform, it, in turn, mechanically causes ceramic layer 20 to deform, and such mechanically induced deformation of ceramic layer 20 piezoelectrically generates a second voltage across the electrodes 25 and 26 of ceramic layer 20. Because the achievable deformation is one or more orders of magnitude greater than is possible in prior Rosen-type transformers, the power transmission capacity of the described transformer 1 is similarly one or more orders of magnitude greater than is possible in prior Rosen-type transformers of a similar size.

While piezoelectric transformers constructed in accordance with the present invention have numerous applications, their use as "Wide-Bandwidth Isolating Transformers" and "Ultra Wide Band Non-isolating Transformers" are of particular interest. These two applications of the present invention are described below.

Wide-Bandwidth Isolating Transformer Applications

A piezoelectric transformer 1 constructed in accordance with the present invention (see FIG. 3) can serve the function of an isolation transformer in many products, particularly in telecommunications-related products. A piezoelectric transformer 1 constructed in accordance with the present invention and inserted within communications circuitry may be used to prevent damaging voltages or currents from flowing in communications wire pairs because metallic DC continuity is not maintained between the two ends of the circuit.

These piezoelectric transformers 1 may be use in communication circuits to pass audio frequency signals 77 with a minimum attenuation (frequency v. amplitude). Thus, in the present transformer 1, the frequency F1 of the output signal 78 will be substantially the same frequency F1 as the input signal while providing step-down voltage transformation of the signal. The transformer 1 also provides isolation safeguards in both the forward and reverse direction, isolating voltages from either the line or equipment side of the circuit. In certain circumstances, a potential rise in a telephone cable caused by lightning or induced load and fault currents from adjacent power lines can be isolated from a substation by an interposed piezoelectric transformer 1, and the potential rise will not find an equalizing path to the substations' wiring, equipment, or grounding system.

It will be appreciated by those skilled in the art that, as a mechanical device, an isolation transformer 1 constructed in accordance with the present invention is considerably different from the standard electromagnetic transformers already in use in the telecommunications industry. Where normal electromagnetic devices can sustain electrical surges and spikes that are typically an order of magnitude higher than their input before saturation, the mechanical nature of the piezoelectric isolation transformer 1 constructed in accordance with the present invention can sustain voltages in excess of several thousand times the input voltage. (Up to a maximum of 35,000 Volts isolation breakdown voltage).

Moreover, as an isolation transformer 1, the present invention can be used on the electrical feed from a commercial utility provider to provide isolation or surge protection in order to prevent damage to customer-attached equipment.

It will be appreciated that a piezoelectric transformer 1 constructed in accordance with the present invention (see FIG. 3) can therefore be used in a telecommunications system to isolate the line side of the utility, integral to the customer-attached equipment. It is through the isolation characteristics that a piezoelectric transformer 1 can withstand line hits in excess of 30,000 Volts.

As a telecommunications line isolation device, the piezoelectric transformer 1 can also be used to protect the customer equipment from surges and spikes that might travel on the telephone lines connected to the outside world. Customer equipment is commonly exposed to spikes and transient voltages that travel on the copper local loop provided by the local Telephone Company. Although communications manufacturers frequently provide electromagnetic "isolation" devices within the equipment that they manufacture, the saturation level of prior transformers is relatively low because the electromagnetic transformers they use in their devices must be kept small to fit within the operating equipment. The small devices do not have enough mass to dissipate the heat that is generated after the input pulse is generated, and, as a result many of the components inside the transformer can break down at different times causing the energy to be passed on to the customer's equipment. The piezoelectric transformer 1 constructed in accordance with the present invention (see FIG. 3), by virtue of its electrical-to mechanical-to electrical transformation, prevents the electrical energy from passing through to the semiconductors of the telecommunications equipment. These transformers are particularly adaptable for implementation with versatile impedance-matching networks, and have the potential for reduced noise generation. These transformers also have a broad thermal range of operation, and are resistant to EMF.

A Wide-Bandwidth Isolating Transformer (WBIT) can be constructed to isolate voltage while transmitting input frequencies in a wide range of bandwidths. Some WBITs may be constructed to function in the audio frequency range. An audio frequency WBIT has an approximate thickness of 0.03 inch, and a length and width of approximately 1.5 inches. The audio frequency WBITs transmit electrical signals (with step-down voltage transformation) from an input terminal to an output terminal, while providing electrical isolation between the input and output terminals. The voltage gain ($V_{out}/V_{in}$) for the audio frequency WBIT is virtually constant over the entire operational frequency range (10 Hz to 30 kHz). Because of the step-down voltage transformation (typically 1:0.07 to 1:0.12) it may be necessary to use an accompanying amplifier for most telecommunications applications of audio frequency WBITs. Such an amplifier can be positioned either on the input or the output side of the audio frequency WBIT.

Audio frequency WBITs have high DC input and output resistance. This property of the Audio Frequency WBITs is particularly adaptable for implementation with versatile impedance-matching networks. Unlike networks used with conventional (i.e. wire-wound electromagnetic) telecommunications transformers, impedance-matching networks used with these WBITs can provide a very good match to twisted-pair and other transmission lines, reducing both line losses and echoes which seriously degrade high-speed data transmission.

Audio Frequency WBITs are particularly well adapted for use in audio frequency range devices in which electrical isolation is desirable—such as in stereo equipment, analog modems, and in telephone lines after the voice/data splitter.

WBITs can also be constructed to isolate voltage while transmitting input frequencies in a bandwidth of data frequencies. A data frequency WBIT has an approximate thickness between 0.05 and 0.125 inch, and an approximate length and width between about 0.07 to 0.50 inch. Through use of Micro Electronic Machining Systems (MEMS), it is anticipated that data frequency WBITs can be built with dimensions in the range of a few microns. The data frequency WBITs also transmit electrical signals (with step-down voltage transformation) from an input terminal to an output terminal, while providing electrical isolation between the input and output terminals. The voltage gain ($V_{out}/V_{in}$) for the data frequency WBIT is virtually constant over the entire operational frequency range (30 kHz to 75 MHz). Because of the step-down voltage transformation (typically 1:0.05 to 1:0.10) it may be necessary to use an accompanying amplifier for most telecommunications applications of data frequency WBITs. Such an amplifier can be positioned either on the input or the output side of the audio frequency WBIT. Through use of Micro Electronic Machining Systems (MEMS), it is anticipated that data frequency WBITs can be built with dimensions in the range of a few microns and can operate at input/output frequencies up to the gigahertz range.

Like audio frequency WBITs, data frequency WBITs have high DC input and output resistance. WBITs can be used in conjunction with amplifiers (positioned either on the input or the output side of the Transoner) to achieve a desired voltage gain.

Data Frequency WBITs are particularly well adapted for use in data frequency range devices in which electrical isolation is desirable—such as in HDSL and VDSL telecommunications, high frequency digital communications, wireless and satellite communications and isolation amplifiers.

WBITs may also be constructed to operate both in the audio frequency range as well as the data frequency range, thus overlapping in frequency ranges. An overlapping frequency WBIT has an approximate thickness of about 0.10 inch, and an approximate length and width ranging from about 0.07 to 0.50 inch. Overlapping frequency WBITs transmit electrical signals from an input terminal to an output terminal over a wide range of input frequencies. This WBIT has the ability to pass both voice and data transmission frequencies simultaneously through a single device. The overlapping frequency WBIT has a virtually flat input-to-output transformation ratio ($V_{out}/V_{in}$).

The overlapping frequency WBIT accomplishes data and audio frequency transmission, while at the same time that it provides electrical isolation between the electrical source and electrical load. This is full high voltage isolation for AC and DC, Common-Mode and Differential Mode. The operational frequency range for this device is from 300 Hz to 500 kHz. However, it is possible to have an operational frequency range from 300 Hz to 20 MHz.

Overlapping frequency WBITs are particularly well adapted for applications requiring electrically isolated transmission of wideband audio and data transmission frequency, such as ADSL transmission lines, digital modems, consumer electronics, power line data transmission, and isolation of audio equipment and telephone lines before the voice/data splitter.

Ultra Wide Band Non-isolating Piezoelectric Transformer Applications

Referring to FIG. 5: An Ultra Wide Band Non-Isolating Transformer (UWBNT) 3 may be constructed in accordance with the present invention which also has applications in the telecommunications industry. UWBNTs may have approximate thicknesses as high as 0.1 inch in discrete form and approximate lengths of about 0.25 inch, but may range down to microns using MEMS fabrication. The UWBNT 3 transmits electrical signals from an input terminal to an output terminal over a wide range of input frequencies. The UWBNT 3 will withstand high differential input voltages and maintain AC isolation; however, does not provide DC isolation between the input and output terminals.

As a mechanical device, the UWBNT 3 constructed in accordance with the present invention (see FIG. 5) achieves higher frequency ranges than standard electromagnetic devices. The UWBNT 3 transformation ratio ranges about 1:0.6 to 1:0.9, and is essentially constant in a frequency range from 400 Hz to 10 MHz. The UWBNT 3 achieves operational bandwidths of 5 to 10 MHz. Using MEMS fabrication, bandwidths exceeding one gigahertz can be produced. The UWBNT 3 is also very small and thin—especially when contrasted to the size of conventional wire-wound transformers.

The UWBNT 3 can easily receive signals from a twisted-pair copper line, but has a low power output capacity, which may be insufficient to independently drive low impedance loads such as twisted-pair copper wires. In such applications a separate transformer, such as a WBIT type, would be advantageous to transmit the signals. Alternatively, an active driver amplifier could be used to complete the output function.

While the above description contains many specificities, these should not be construed as limitations on the scope of the invention, but rather as an exemplification of one preferred embodiment thereof. Many other variations are possible, for example:

While in the preferred embodiment of the invention the ceramic layers 10 and 20 are preferably constructed of a PZT ceramic material, other electroactive materials may be used in their place;

While in the preferred embodiment of the invention both opposing major faces of each of the ceramic layers 10 and 20 are pre-coated with electro-deposited electrodes, it is within the scope of the present invention to construct the HDP transformer from ceramic layers that have only their outboard surfaces electroplated, provided that the transformer is constructed such that the center electrode(s) is(are) intimately in contact with each of the ceramic layers.

An electrically conductive adhesive may used to bond the ceramic layers to the center electrode.

The various laminate layers (i.e. the ceramic layers, the dielectric layer, the electrodes and the adhesives) may be bonded to each other without sequentially heating and cooling so as to pre-stress the ceramic members;

The two ceramic layers may be constructed of either similar or dissimilar piezoelectric materials which may either have identical or dissimilar piezoelectric coefficients;

The two ceramic layers may either be of equal or unequal thicknesses;

The two ceramic layers can be piezoelectric, ferroelectric or other electroactive elements;

"Soft" ceramic materials may alternatively be used for both (i.e. driver and driven) sides of the transformer.

"Hard" ceramic materials may alternatively be used for both (i.e. driver and driven) sides of the transformer.

A plurality of exterior electrodes may be located on either or both the input (i.e. "driver") side of the output (i.e., "driven") side of the transformer.

The electrodes need not cover the entire surface of the ceramic layers.

Accordingly, the scope of the invention should be determined not by the embodiment illustrated, but by the appended claims and their legal equivalents.

I claim:

1. An electrical energy transfer device, comprising:
   a first electroactive ceramic layer having opposing electroded major faces which are disposed on the opposite sides of a first longitudinal plane;
   said first electroactive ceramic layer being polarized normal to said first longitudinal plane such that upon application of a voltage across said opposing electroded major faces, said first electroactive ceramic layer deforms parallel to said first longitudinal plane;
   a second electroactive ceramic layer having opposing electroded major faces which are disposed on the opposite sides of a second longitudinal plane;
   said second electroactive ceramic layer being polarized normal to said second longitudinal plane such that upon application of a mechanical stress parallel to said second longitudinal plane, said second electroactive ceramic layer generates a voltage between said opposing electroded major faces;
   a dielectric layer with first and second opposing major faces;
   said first opposing major face of said dielectric layer being bonded to an opposing electroded major face of said first electroactive ceramic layer;
   said second opposing major face of said dielectric layer being bonded to an opposing electroded major face of said second electroactive ceramic layer;
   a first adhesive layer between said first face of said dielectric layer and one of said electroded major faces of said first electroactive ceramic layer;
   wherein said first adhesive layer exerts a compressive stress on said first electroactive ceramic layer and said dielectric layer parallel to said first longitudinal plane;
   a second adhesive layer between said second face of said dielectric layer and one of said electroded major faces of said second electroactive ceramic layer;
   wherein said second adhesive layer exerts a compressive stress on said second electroactive ceramic layer and said dielectric layer parallel to said second longitudinal axis; and
   a signal source for generating a signal of a first voltage and a first frequency;
   said signal source being electrically connected across said electroded major faces of said first electroactive ceramic layer;
   wherein said first electroactive ceramic layer is adapted to expand and contract parallel to said first longitudinal plane at said first frequency upon application of said first voltage across said electroded major faces;

and wherein said dielectric layer is adapted to expand and contract parallel to said first longitudinal plane upon said expansion and contraction of said first electroactive ceramic layer;

and wherein said second electroactive ceramic layer is adapted to expand and contract parallel to said second longitudinal plane upon said expansion and contraction of said dielectric layer;

and wherein said second electroactive ceramic layer is adapted to generate a second voltage across said electroded major faces upon said expansion and contraction of said second electroactive ceramic layer parallel to said second longitudinal plane;

and wherein said second voltage is of the same frequency as said first voltage.

2. The electrical energy transfer device of claim 1, wherein said first and second electroactive ceramic layers, and said dielectric layer are of substantially the same shape in said first and second longitudinal planes, said shape being a rectangle having a length and a width;

and wherein a ratio between said length and said width is a non-integer.

3. The electrical energy transfer device of claim 1, The electrical energy transfer device of claim 1, wherein said first and second electroactive ceramic layers, and said dielectric layer are of substantially the same shape in said first and second longitudinal planes, said shape being an ellipse having a major axis and a minor axis;

and wherein a ratio between said major axis and a minor axis is greater than one.

* * * * *

(12) EX PARTE REEXAMINATION CERTIFICATE (4969th)

United States Patent
Bishop

(10) Number: US 6,229,247 C1
(45) Certificate Issued: Jul. 27, 2004

(54) MULTI-LAYER PIEZOELECTRIC ELECTRICAL ENERGY TRANSFER DEVICE

(75) Inventor: Richard Patten Bishop, Fairfax Station, VA (US) 22039

(73) Assignee: Richard Patten Bishop, Fairfax Station, VA (US)

Reexamination Request:
No. 90/006,134, Oct. 25, 2001

Reexamination Certificate for:
Patent No.: 6,229,247
Issued: May 8, 2001
Appl. No.: 09/318,966
Filed: May 26, 1999

Related U.S. Application Data

(60) Provisional application No. 60/107,623, filed on Nov. 9, 1998.

(51) Int. Cl.[7] .............................................. H01L 41/08
(52) U.S. Cl. ........................ 310/328; 310/331; 310/366
(58) Field of Search ........................................ 310/359

(56) References Cited

U.S. PATENT DOCUMENTS

| 3,363,139 | A | * | 1/1968 | Schiavone | 310/359 |
| 3,590,287 | A | * | 6/1971 | Berlincourt et al. | 310/359 |
| 3,683,211 | A | * | 8/1972 | Perlman | 310/359 |
| 5,118,982 | A | * | 6/1992 | Inoue et al. | 310/366 |
| 5,632,841 | A | * | 5/1997 | Hellbaum et al. | 310/311 |
| 6,229,247 | B1 | * | 5/2001 | Bishop | 310/328 |

* cited by examiner

Primary Examiner—Thomas M. Dougherty

(57) ABSTRACT

A multi-layered piezoelectric electrical energy transfer device has its input and output sides electrically isolated from each other. As a transformer, the device provides step-down voltage conversion while the output signal preserves the input signal frequency in a broad bandwidth. For telecommunications applications, the transformer can provide impedance matching with transmission lines, which minimizes line losses and echoes that seriously degrade high-speed data transmission. The piezoelectric transformer also provides a uniform voltage transformation ratio ($V_{out}/V_{in}$) over wide frequency ranges, and is adaptable for simultaneous audio and data signal telecommunications applications requiring wide bandwidth service.

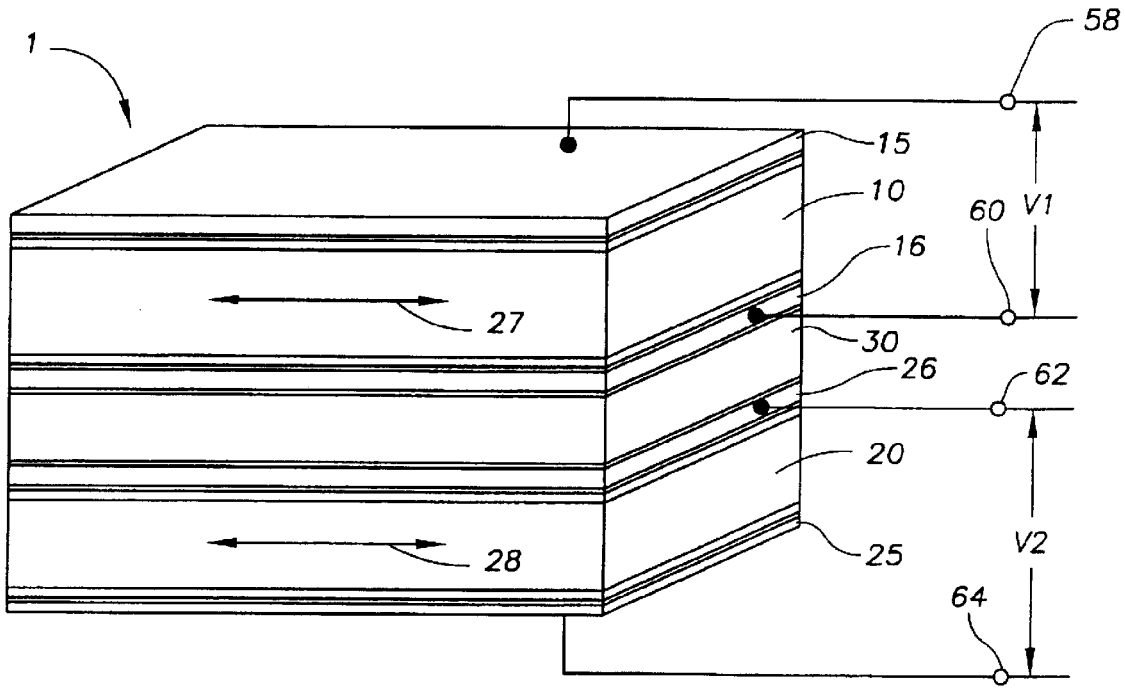

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–3 is confirmed.

* * * * *